United States Patent [19]

Sakuragi et al.

[11] Patent Number: 5,455,580
[45] Date of Patent: Oct. 3, 1995

[54] CIRCUIT DEVICE UTILIZING A PLURALITY OF TRANSISTOR PAIRS

[75] Inventors: Takamasa Sakuragi; Takahiro Shirai; Katsuhito Sakurai, all of Kanagawa, Japan

[73] Assignee: Canon Kabushiki Kaisha, Tokyo, Japan

[21] Appl. No.: 170,380

[22] Filed: Dec. 20, 1993

[30] Foreign Application Priority Data

Dec. 25, 1992 [JP] Japan .................................. 4-357743

[51] Int. Cl.$^6$ .................................................. H03M 1/66
[52] U.S. Cl. ................................................................ 341/133
[58] Field of Search ................................... 341/133, 136, 341/135, 127, 144

[56] References Cited

U.S. PATENT DOCUMENTS 4,644,325  2/1987  Miller ........................... 341/144

FOREIGN PATENT DOCUMENTS 164313  9/1983  Japan .

Primary Examiner—Brian K. Young
Attorney, Agent, or Firm—Robin, Blecker, Daley & Driscoll

[57] ABSTRACT

A circuit device according to the present invention comprises a plurality of transistor pairs, the number of which corresponds to a quantizing bit number, each of the plurality of transistor pairs being a pair of transistors having respective control electrodes connected to each other and respective first primary electrodes connected to each other, and a connecting line arranged to connect in series a second primary electrode of one transistor of one transistor pair among the plurality of transistor pairs to first primary electrodes of another transistor pair among the plurality of transistor pairs so as to constitute a binary-weighted current source. With the above-described arrangement, it is possible to reduce an area to be occupied by the circuit device and it is also possible to miniaturize the circuit device. Further, it is possible to reduce the cost of the circuit device.

17 Claims, 2 Drawing Sheets

CIRCUIT DEVICE UTILIZING A PLURALITY OF TRANSISTOR PAIRS

BACKGROUND OF THE INVENTION

1. Field of the Invention

The present invention relates to a circuit device.

2. Description of the Related Art

Several types of D-A converters utilizing current sources have heretofore been known, such as a type in which the value of each binary-weighted current source is added to the value of the next one by using transistors and a type which employs equal current sources and R-2R ladder resistors.

However, such a conventional type of D-A converter has a number of problems. For example, in the case of the binary-weighted current source type of D-A converter, since linearity error, which is the most important performance index, is determined by the relative accuracy between transistors which constitute each current source, it is necessary to form transistors having emitter area ratios of up to 1:32, for example, in a 6-bit D-A converter. As a result, an area to be occupied by such a D-A converter on a semiconductor circuit device becomes extremely large and an increase in cost is incurred. If a quantizing bit number is increased, the above-described problem becomes serious. In the D-A converter of the type which employs equal current sources and R-2R ladder resistors, if the relative accuracy between R-2R ladder resistors is increased up to a generally necessary value, an extremely large area is needed. This still leads to a further increase in cost.

SUMMARY OF THE INVENTION

It is, therefore, an object of the present invention to solve the above-described problems.

Another object of the present invention is to provide a circuit device which can be reduced in area to be occupied, which can be miniaturized and which can be reduced in cost.

To achieve the above objects, in accordance with one aspect of the present invention, there is provided a circuit device which comprises a plurality of transistor pairs, the number of which corresponds to a quantizing bit number, each of the plurality of transistor pairs being a pair of transistors having respective control electrodes connected to each other and respective first primary electrodes connected to each other, and a connecting line arranged to connect in series a second primary electrode of one transistor of one transistor pair among the plurality of transistor pairs to first primary electrodes of another transistor pair among the plurality of transistor pairs so as to constitute a binary-weighted current source.

The above and other objects, features and advantages of the present invention will become apparent from the following detailed description of preferred embodiments of the present invention, taken in conjunction with the accompanying drawings.

DETAILED DESCRIPTION OF THE PREFERRED EMBODIMENTS

Preferred embodiments of the present invention will be described below with reference to the accompanying drawings.

Figure 1:
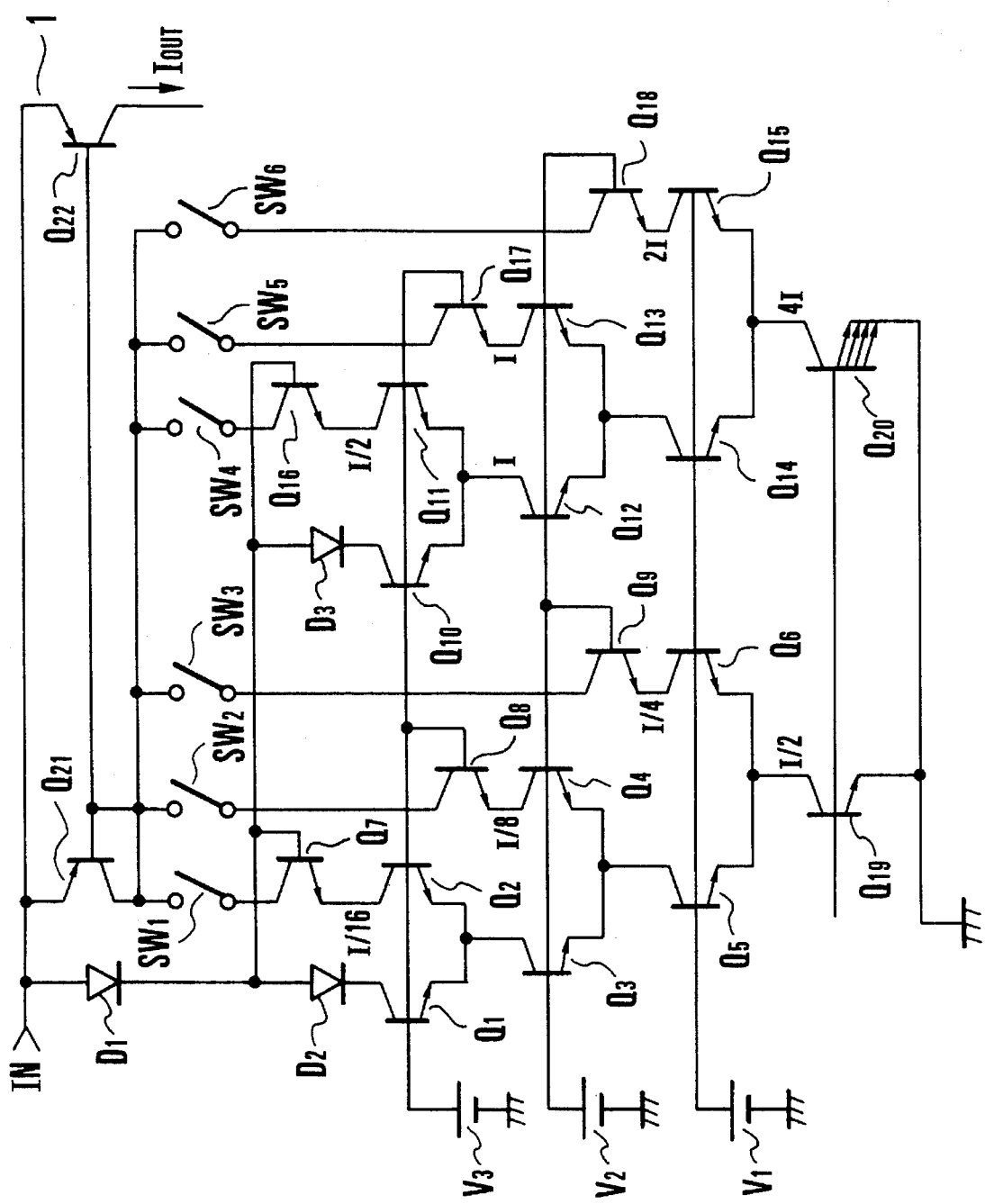
FIG. 1 is a diagram showing the circuit arrangement of a D-A converter which constitutes a first embodiment of a circuit device according to the present invention.

FIG. 1 is a circuit diagram showing one example of a D-A converter which constitutes a first embodiment of a circuit according to the present invention. The D-A converter which constitutes the first embodiment of the present invention is a 6-bit current output type of D-A converter.

In FIG. 1, reference numeral 1 denotes a D-A converter having a power source voltage IN. The arrangement shown in FIG. 1 includes a power source voltage 1, switches $SW_1$ to $SW_6$ which are arranged to be individually switched according to the digital input of the D-A converter, and NPN transistors $Q_{19}$ and $Q_{20}$ which are disposed to form a current mirror arrangement. The emitter size of the NPN transistor $Q_{19}$ is selected so that its collector current becomes I/2 (I is an arbitrary amount of current), while the emitter size of the NPN transistor $Q_{20}$ is selected so that its collector current becomes 4×I. The shown arrangement also includes NPN emitter-coupled transistors (which form a pair of NPN transistors) $Q_1$ and $Q_2$, $Q_3$ and $Q_4$, $Q_5$ and $Q_6$, $Q_{10}$ and $Q_{11}$, $Q_{12}$ and $Q_{13}$, and $Q_{14}$ and $Q_{15}$. Each of the NPN transistor pairs is arranged in such a manner that the base and emitter of one NPN transistor are respectively connected to the base and emitter of the other NPN transistor. The shown arrangement further includes bias voltage sources $V_1$ to $V_3$ which are respectively set to appropriate voltage values so that the associated ones of the NPN transistors $Q_1$ to $Q_6$ and $Q_{10}$ to $Q_{15}$ as well as NPN transistors $Q_7$, $Q_8$, $Q_9$, $Q_{16}$, $Q_{17}$ and $Q_{18}$ can be set to their active states. The base of each of the transistors $Q_8$ and $Q_{17}$ and the base of each of the transistors $Q_9$ and $Q_{18}$ are connected to the base voltage sources $V_3$ and $V_2$, respectively.

As described above, the emitter size of the NPN transistor $Q_{20}$ is adjusted by an appropriate constant current circuit so that its collector current becomes 4×I. The NPN transistors $Q_{14}$ and $Q_{15}$, the emitter of each of which is connected to the collector of the NPN transistor $Q_{20}$, are connected by their bases and biased by the voltage of the bias voltage source $V_1$. Since the collector potential of each of the NPN transistors $Q_{14}$ and $Q_{15}$ becomes a potential which is $1V_{BE}$ lower than the potential of the bias voltage source $V_2$, the NPN transistors $Q_{14}$ and $Q_{15}$ are biased approximately equivalently. Accordingly, the collector currents of the NPN transistors $Q_{14}$ and $Q_{15}$ become equal, so that if their base currents are neglected, the collector current of each of the NPN transistors $Q_{14}$ and $Q_{15}$ becomes 2×I which is half the collector current of the NPN transistor $Q_{20}$.

Similar operations respectively occur among the NPN transistors $Q_{12}$, $Q_{13}$ and $Q_{14}$, among the NPN transistors $Q_{10}$, $Q_{11}$ and $Q_{12}$, among the NPN transistors $Q_5$, $Q_6$ and $Q_{19}$, among the NPN transistors $Q_3$, $Q_4$ and $Q_5$, and among the NPN transistors $Q_1$, $Q_2$ and $Q_3$. Accordingly, the collector current of each of the NPN transistors $Q_1$ and $Q_2$ becomes I/16, the collector current of each of the NPN transistors $Q_3$ and $Q_4$ becomes I/8, the collector current of each of the NPN transistors $Q_5$ and $Q_6$ becomes I/4, the collector current of each of the NPN transistors $Q_{10}$ and $Q_{11}$ becomes I/2, and the collector current of each of the NPN transistors $Q_{12}$ and $Q_{13}$ becomes I. Thus, the binary-weighted current sources of from I/16 to 2×I are obtained.

By selectively switching the current sources by the switches $SW_1$ to $SW_6$, the collector current of a current summary PNP transistor $Q_{21}$ is outputted as an analog current which is obtained by digital-to-analog conversion according to a digital input which controls the on/off operations of the individual switches $SW_1$ to $SW_6$. The output current of the PNP transistor $Q_{21}$ is provided at the collector of a PNP transistor $Q_{22}$ which is connected to the PNP transistor $Q_{21}$ to form an current mirror arrangement.

Of the NPN transistors $Q_1$ to $Q_{20}$, the NPN transistors $Q_7$ to $Q_9$ and the NPN transistors $Q_{16}$ to $Q_{18}$ are inserted for the purpose of making equal the collector potentials of the associated emitter-coupled transistor pairs and highly accurately adjusting the collector currents to a uniform level for each of the emitter-coupled transistor pairs.

It is to be noted that it is, of course, possible to adopt an arrangement in which the NPN transistors $Q_1$ to $Q_{20}$ are replaced with PNP transistors, whereas the PNP transistors $Q_{21}$ and $Q_{22}$ are replaced with NPN transistors.

Figure 2:
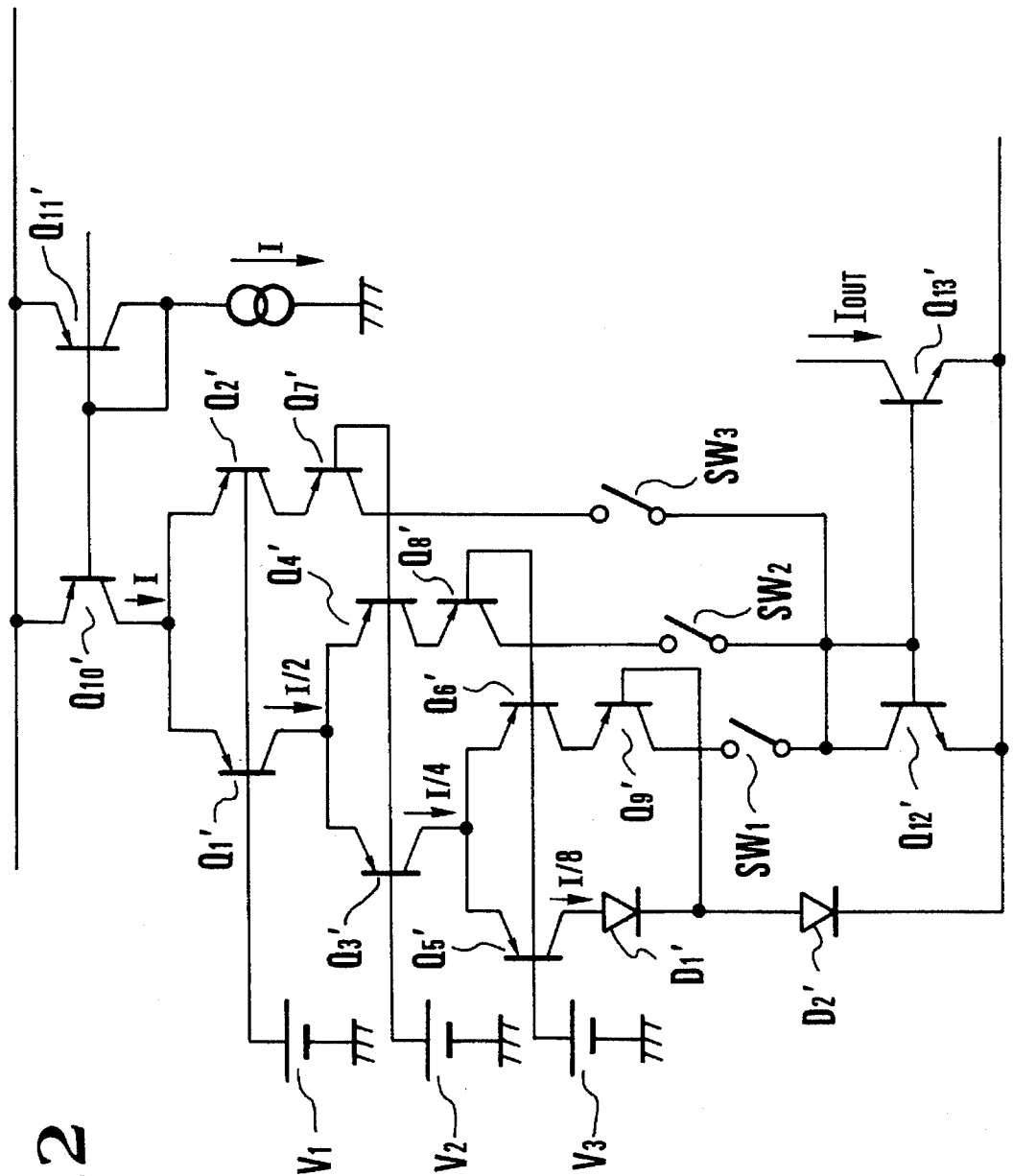
FIG. 2 is a diagram showing the circuit arrangement of a D-A converter which constitutes a second embodiment of the circuit device according to the present invention.

In the description of the first embodiment shown in FIG. 1, reference has been made to one example of a 6-bit D-A converter. However, the number of bits can be increased or decreased by increasing or decreasing the number of connection stages of emitter-coupled transistor pairs. FIG. 2 is a circuit diagram of a second embodiment and shows one example of a 3-bit D-A converter whose transistors are of opposite polarity to the transistors used in the embodiment shown in FIG. 1. In the shown arrangement, PNP transistors $Q_{10}'$ and $Q_{11}'$ are provided for supplying a current I to PNP transistors $Q_1'$ and $Q_2'$. The output current of this arrangement is provided at the collector of an NPN transistor $Q_{13}'$ which is connected to an NPN transistor $Q_{12}'$ to form a current mirror arrangement.

It is also possible to adopt an arrangement in which the aforesaid emitter-coupled NPN transistors are replaced with N type field effect transistors which are connected together gate to gate and source to source. In the arrangement shown in FIG. 2, the emitter-coupled PNP transistors may also be replaced with P type field effect transistors. With either of the arrangements, it is possible to achieve similar advantages.

As is apparent from the foregoing description, according to either of the first and second embodiments, it is possible to construct a D-A converter made up of transistor pairs while taking account of only the relative accuracy between two transistors which constitute each of the transistor pairs. Accordingly, an area to be occupied by a D-A converter on a semiconductor circuit device can be made small compared to conventional examples. Similarly, it is possible to form a D-A converter of high bit accuracy while taking account of the characteristics of two transistors which are paired at an emitter area ratio of 1:1. Accordingly, in the formation of such a D-A converter, the extent of increase of an area to be occupied by the D-A converter on a chip can be made extremely small compared to the conventional examples, so that no cost increase is incurred.

What is claimed is:

1. A circuit device comprising:
   (A) a plurality of transistor pairs, the number of which corresponds to a quantizing bit number, each of said plurality of transistor pairs being a pair of transistors having respective control electrodes connected to each other and respective first primary electrodes connected to each other;
   (B) a connecting line arranged to connect in series a second primary electrode of one transistor of one transistor pair among said plurality of transistor pairs to first primary electrodes of another transistor pair among said plurality of transistor pairs so as to constitute a binary-weighted current source; and
   (C) a plurality of switches each receiving, as an input, current output from a distinct one of said plurality of transistor pairs.

2. A circuit device according to claim 1, wherein said circuit device is a D-A converter for converting a digital signal into an analog signal.

3. A circuit device according to claim 1, wherein said circuit device is an integrated circuit formed by a semiconductor process.

4. A circuit device according to claim 1, wherein each of the first primary electrodes is an emitter electrode.

5. A circuit device according to claim 1, wherein the second primary electrode is a collector electrode.

6. A circuit device according to claim 2, wherein each of said switches is switched between on and off states in accordance with the input digital signal.

7. A circuit device according to claim 1, further comprising a bias voltage source for generating a bias voltage, which is set to a predetermined voltage value, to set said plurality of transistor pairs to their active states.

8. A circuit device according to claim 1, wherein each of said plurality of transistor pairs includes two NPN transistors.

9. A circuit device according to claim 1, wherein each of said plurality of transistor pairs includes two PNP transistors.

10. A circuit device according to claim 1, wherein each of said plurality of transistor pairs includes two N type field effect transistors.

11. A circuit device according to claim 1, wherein each of said plurality of transistor pairs includes two P type field effect transistors.

12. A binary-weighted current source comprising:
   (A) first and second semiconductors generating output currents respectively of magnitudes N, where N is an integer, and N/M, where M is an integer and is equal to the desired number of different binary-weighted source output currents; and
   (B) first and second pluralities of circuit means respectively receiving the output currents of said first and second semiconductors, the circuit means of said first plurality being series connected, the circuit means of said second plurality being series connected, each of said circuit means being operative to output current equal to one half of current input thereto.

13. A current source according to claim 12, further including a plurality of switch means for selectively outputting current input thereto, each switch means being connected to receive output current of a distinct one of said circuit means.

14. A current source according to claim 13, further including current summing means for summing currents output by said plurality of switch means.

15. A current source according to claim 12, wherein said first and second semiconductors are transistors and wherein an emitter area of said first semiconductor is N times the emitter area of said second semiconductor.

16. A current source according to claim 15, wherein each said circuit means comprises a pair of transistors having equal emitter areas.

17. A circuit device comprising:
   (A) a plurality of transistor pairs, the number of which corresponds to a quantizing bit number, each of said plurality of transistor pairs being a pair of transistors having respective control electrodes connected to each other and respective first primary electrodes connected to each other; and (B) a connecting line arranged to connect in series a second primary electrode of one transistor of one transistor pair among said plurality of transistor pairs to first primary electrodes of another transistor pair among said plurality of transistor pairs so as to constitute a binary-weighted current source; and (C) biasing means for generating bias voltage to set said plurality of transistor pairs to their active states.

* * * * *

UNITED STATES PATENT AND TRADEMARK OFFICE
CERTIFICATE OF CORRECTION

PATENT NO. : 5,455,580
DATED : October 3, 1995
INVENTOR(S) : Takamasa Sakuragi, Takahiro Shirai and Katsuhito Sakurai It is certified that error appears in the above-indentified patent and that said Letters Patent is hereby corrected as shown below:

Col. 1, line 30, delete "still".

Col. 2, Line 59, change "1/16" to -- I/16 --.

Col.3, line 1, change "summary" to -- summing --.

Col. 3, line 9, change "$Q18$" to -- $Q_{18}$ --.

Signed and Sealed this

Sixteenth Day of April, 1996

BRUCE LEHMAN

Attest:

*Attesting Officer*   *Commissioner of Patents and Trademarks*